United States Patent [19]
Hieda

[11] Patent Number: 5,914,510
[45] Date of Patent: Jun. 22, 1999

[54] SEMICONDUCTOR MEMORY DEVICE AND METHOD OF MANUFACTURING THE SAME

[75] Inventor: Katsuhiko Hieda, Kawasaki, Japan

[73] Assignee: Kabushiki Kaisha Toshiba, Kanagawa-Ken, Japan

[21] Appl. No.: 08/766,491

[22] Filed: Dec. 13, 1996

[51] Int. Cl.$^6$ .................................................. H01L 27/01
[52] U.S. Cl. ........................ 257/301; 257/305; 257/350
[58] Field of Search .................................. 257/301–305, 257/347, 350

[56] References Cited

U.S. PATENT DOCUMENTS

| | | | |
|---|---|---|---|
| 4,649,625 | 3/1987 | Lu .............................................. | 29/571 |
| 4,713,678 | 12/1987 | Womack et al. ........................ | 357/23.6 |
| 4,791,610 | 12/1988 | Takemae .................................. | 365/149 |
| 4,792,834 | 12/1988 | Uchida .................................... | 257/304 |
| 4,800,527 | 1/1989 | Ozaki et al. ............................. | 365/182 |
| 4,894,697 | 1/1990 | Chin et al. .............................. | 357/23.6 |
| 4,920,065 | 4/1990 | Chin et al. ............................... | 437/52 |
| 4,942,554 | 7/1990 | Kircher et al. .......................... | 365/149 |
| 4,984,039 | 1/1991 | Douglas .................................. | 357/55 |
| 5,065,273 | 11/1991 | Rajeevakumar ........................ | 257/301 |
| 5,119,155 | 6/1992 | Hieda et al. ............................ | 357/23.6 |
| 5,250,829 | 10/1993 | Bronner et al. ......................... | 257/301 |
| 5,315,543 | 5/1994 | Matsuo et al. .......................... | 365/149 |
| 5,349,218 | 9/1994 | Tadaki et al. ............................ | 257/296 |
| 5,357,131 | 10/1994 | Sunami et al. .......................... | 257/301 |
| 5,414,285 | 5/1995 | Nishihara ................................ | 257/301 |
| 5,442,211 | 8/1995 | Kita ........................................ | 257/301 |
| 5,606,188 | 2/1997 | Bronner et al. ......................... | 257/304 |

OTHER PUBLICATIONS

Patent Abstract of Japan; Publication No. 6–104398, published Apr. 15, 1994 for "Semiconductor Storage Device and Manufacture Thereof".

Patent Abstract of Japan; Publication No. 4–212451, published Aug. 4, 1992 for "Semiconductor Storage Device and Manufacture Thereof".

*Primary Examiner*—Mark V. Prenty
*Attorney, Agent, or Firm*—Banner & Witcoff, Ltd

[57] ABSTRACT

A semiconductor memory device having a first memory cell and a second memory cell, includes a first semiconductor substrate having a first conductivity type, a first layer having a second conductivity type serving as a buried plate electrode, a first capacitor insulating film in the first memory cell, a second capacitor insulating film in the second memory cell, a second layer contacting the first capacitor insulating film having a second conductivity type serving as a memory node, a third layer contacting the second capacitor insulating film having a second conductivity type serving as a memory node, wherein an upper surface of the semiconductor substrate and an upper surface of the second layer and the third layer form a step height.

26 Claims, 12 Drawing Sheets

WAFER BONDING
BONDING SURFACE

FIG. 6C

POLISHING

CELL LAYOUT

FIG. 9B

SEMICONDUCTOR MEMORY DEVICE AND METHOD OF MANUFACTURING THE SAME

BACKGROUND OF THE INVENTION

1. Technical Field

The present invention generally relates to a semiconductor device and, more particularly, to a semiconductor memory device having a silicon-on-insulator (SOI) structure and a method of manufacturing the same.

2. Description of Related Art

Figure 1:
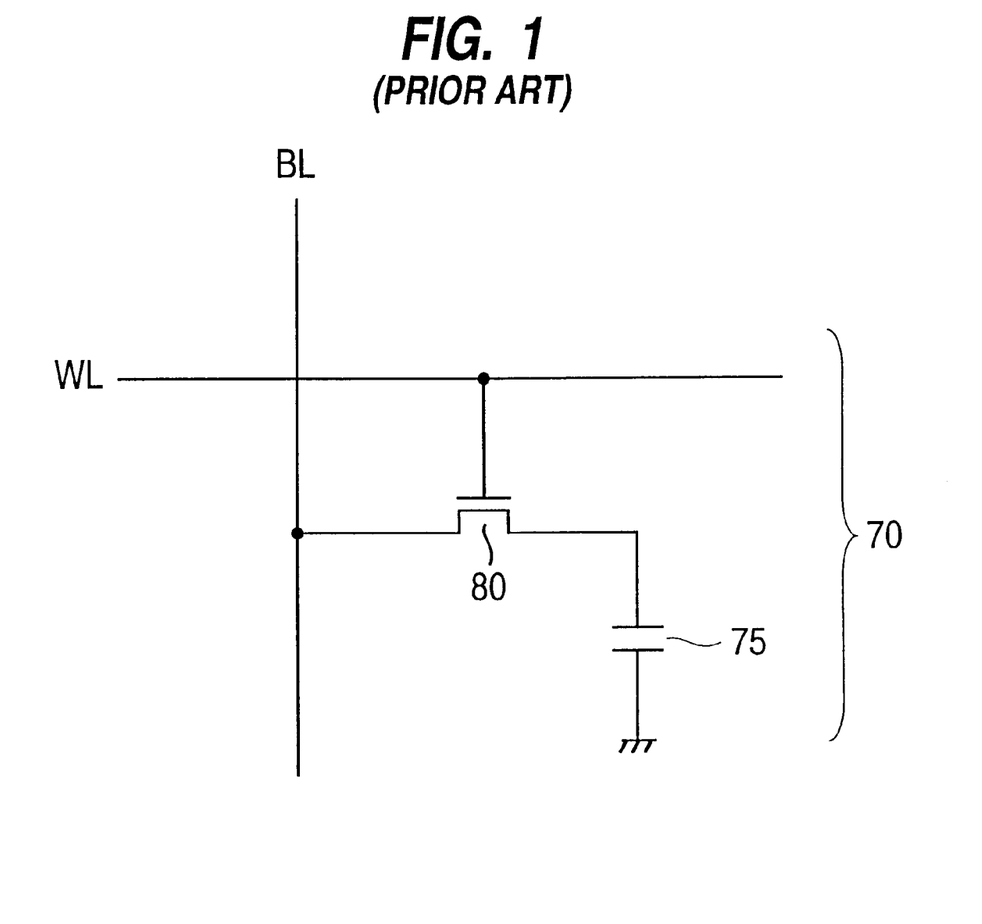
FIG. 1 is a circuit diagram of a conventional DRAM cell.

FIG. 1 is a circuit diagram of a conventional memory cell 70 used in a dynamic random access memory (DRAM). Memory cell 70 includes a storage capacitor 75 for storing charges and a MOS transfer transistor (or "transfer gate") 80 for controlling charge transfer. One end of the source-drain path of MOS transistor 80 is connected to bit line BL and the other end of the source-drain path of MOS transistor 80 is connected to a first electrode of capacitor 75. A second electrode of capacitor 75 is connected to a predetermined potential such as ground potential. The gate of MOS transistor 80 is connected to word line WL to which signals are applied for controlling the transfer of charges between storage capacitor 75 and bit line BL, thereby reading and writing data. While it is desirable to increase the integration density of memory cells on a memory chip by making the MOS transfer transistor and the storage capacitor smaller, the capacitor must nonetheless be large enough to store sufficient charge for ensuring that data is correctly read from and written to the memory cell. So-called trench capacitors have been developed to increase the capacitance of the storage capacitor while permitting the integration density of the memory cells to be increased.

Figure 8:
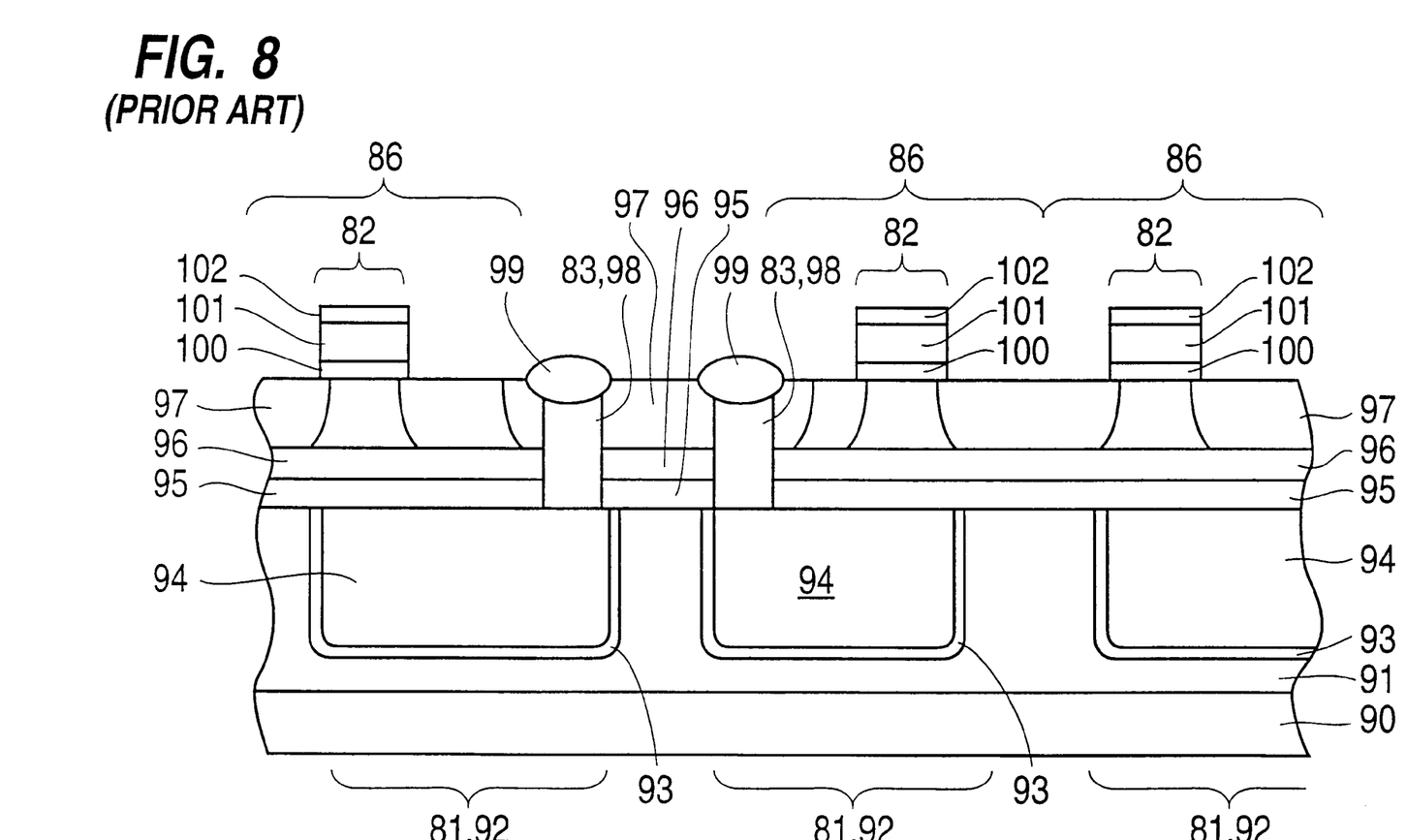
FIG. 8 is a sectional view of the conventional DRAM cell.

As shown in FIG. 8, there is a semiconductor memory device including trench capacitors 81 in a first semiconductor substrate 90, a connecting diffusion region 83 between the trench capacitor 81 and source/drain region, and MOS transistor 86 disposed on the trench capacitor 81. This conventional art is described in Japanese Patent Disclosure (Kokai 6-104398, published on Apr. 15, 1994). Namely, this conventional device achieves high density DRAM using the capacitor disposed under the MOS transistor. There is only one gate 82 on the capacitor 81. Namely, there are a first semiconductor substrate 90, an n-type well layer 91 disposed on the substrate 90, a trench 92 disposed in the n-type well layer 91, a capacitor insulating film 93 disposed over the surface of the trench 92, a first polycrystalline silicon layer 94 filled up in the trench 92, a first SiO$_2$ layer 95 deposited over the n-type well layer 91 and the first polycrystalline silicon layer 94, a second SiO$_2$ layer 96 bonded to the first SiO$_2$ layer 95, a second semiconductor substrate 97 disposed on the second SiO$_2$ layer 96, a second polycrystalline silicon 98 performing as the connecting diffusion region 83, a thermal oxide layer 99 disposed on the second polycrystalline silicon layer 98, a gate oxide layer 100 disposed on the second semiconductor substrate 97, a gate polycrystalline silicon 101 disposed on the gate oxide layer 100, Si$_3$N$_4$ layer 102 disposed on the gate polycrystalline silicon 101, a source/drain region diffused in the second semiconductor layer 97, and an n-type diffusion region for connecting the connecting diffusion region 83 and the source/drain region.

SUMMARY OF THE INVENTION

It is an object of the present invention to provide a high density semiconductor device wherein a high accuracy connection between the through hole and the capacitor electrode on the trench can be achieved. Also, it is a further object of the present invention to provide a method of manufacturing a semiconductor device which provides a self aligned through hole to connect a diffusion region and a memory node.

In accordance with the present invention, a semiconductor memory device includes:

a first semiconductor substrate having a first conductivity type;

a first layer having a second conductivity type serving as a buried plate electrode;

a first capacitor insulating film in the first memory cell;

a second capacitor insulating film in the second memory cell;

a second layer contacting the first capacitor insulating film having a second conductivity type serving as a memory node;

a third layer contacting the second capacitor insulating film having a second conductivity type serving as a memory node;

a first cap oxide film formed on the second layer;

a second cap oxide film formed on the third layer;

a first oxide film formed on the surface of the first cap oxide film;

a second oxide film formed on the surface of the second cap oxide film;

a first transfer transistor formed on the first oxide film having a source and drain region of the second conductivity type;

a second transfer transistor formed on the second oxide film having a source and drain region of the second conductivity type;

an isolation film formed on the first and second oxide film isolating the first memory cell and the second memory cell;

a first polysilicon region electrically connecting the second layer and the source and drain regions of the first transfer transistor;

a second polysilicon region electrically connecting the third layer and the source and drain regions of the second transfer transistor;

a third cap oxide formed on the first polysilicon region; and a fourth cap oxide formed on the second polysilicon region.

Also, in accordance with the present invention, a method of manufacturing a semiconductor memory device includes forming openings in a first semiconductor substrate. Doped polysilicon is deposited in the openings and an insulating film is formed on the surface of the first substrate. A second semiconductor substrate having an insulating film formed thereon is bonded to the first substrate. The upper semiconductor substrate is then etched to a predetermined thickness and silicon-on-insulator (SOI) islands are formed. Through holes to the memory nodes are formed and polysilicon layers are formed in the through holes. Switching transistors are formed on the top silicon layer and are connected to the storage nodes via the polysilicon layers in the through holes.

These and other features and advantages of the present invention will be better understood from a reading of the following detailed description in conjunction with the accompanying drawings.

DETAILED DESCRIPTION

Figure 2:
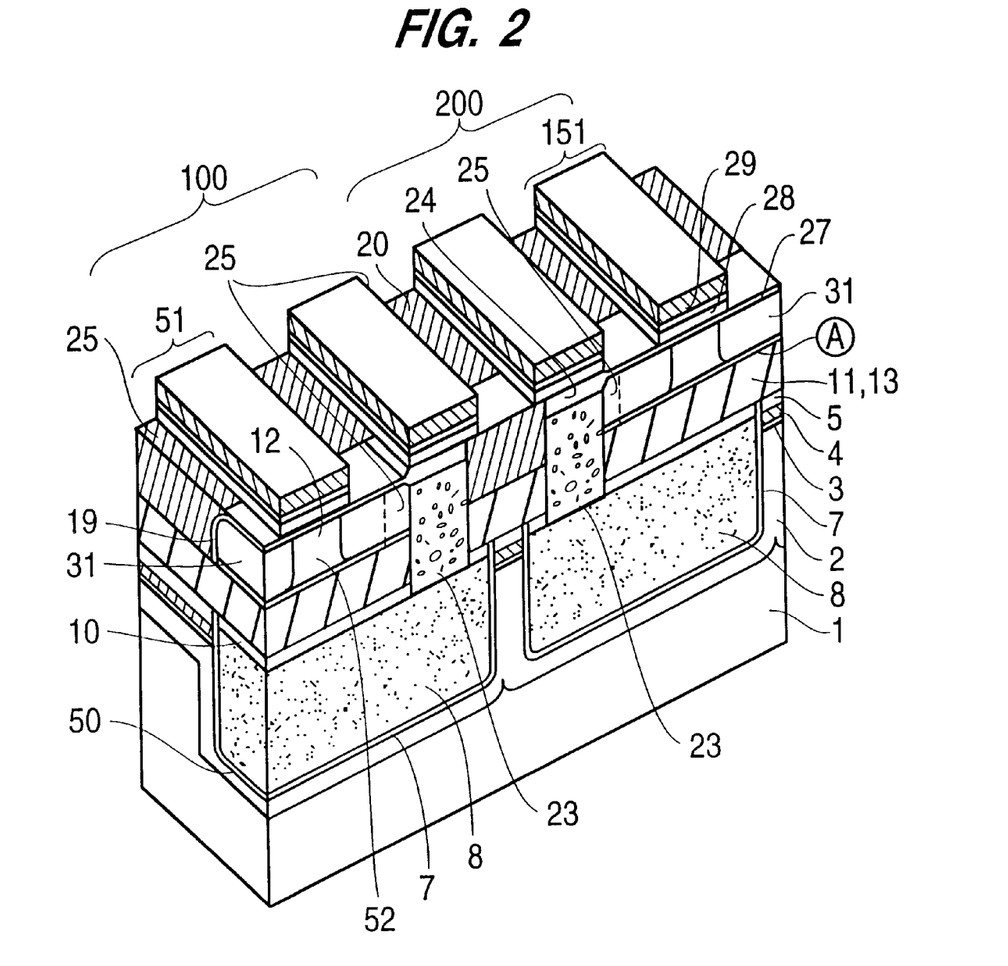
FIG. 2 is a perspective view of the cell structure of memory cells in accordance with the present invention.
Figure 3:
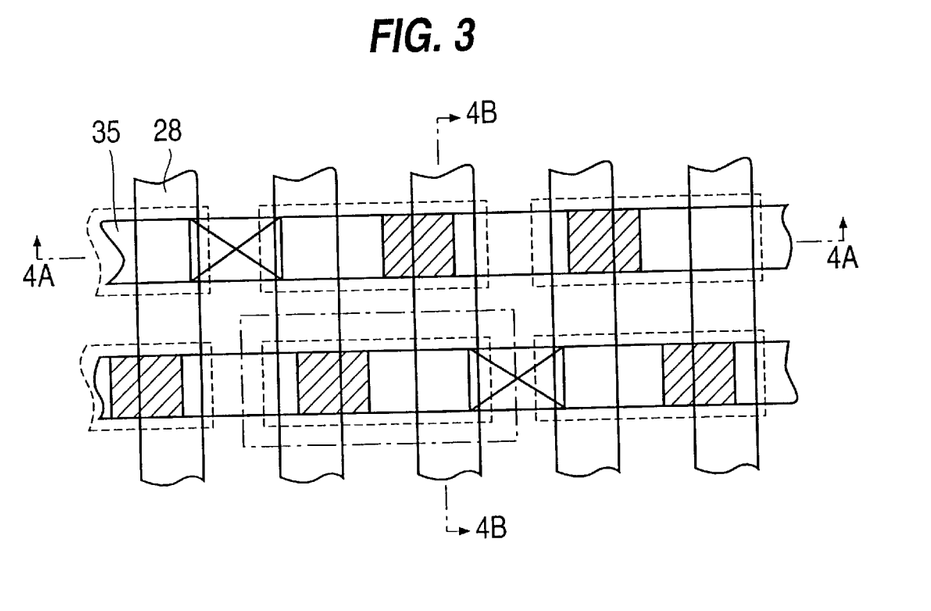
FIG. 3 is an upper plan view of the semiconductor memory device of FIG. 2.
Figure 4A:
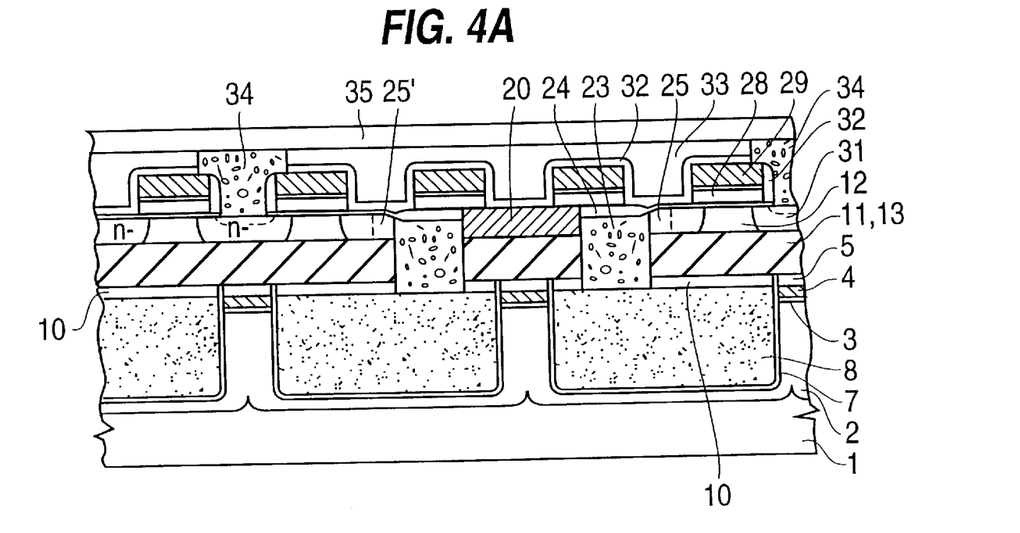
FIG. 4A is a sectional view along line I–I' of FIG. 3.
Figure 4B:
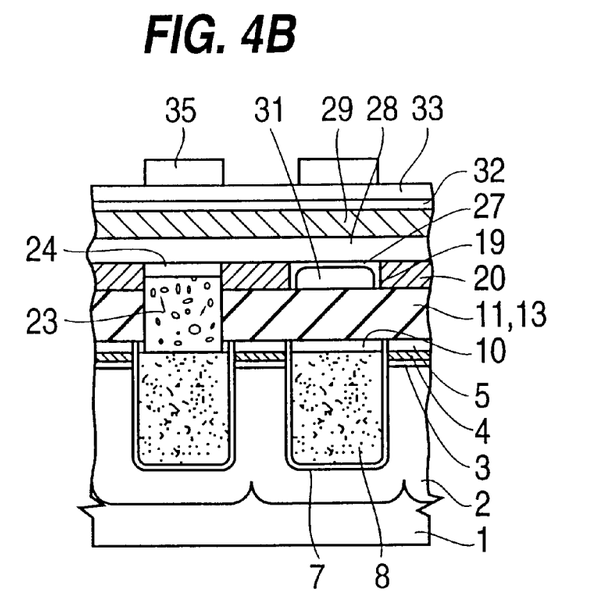
FIG. 4B is a sectional view along line II–II' of FIG. 3.

FIG. 2 is a perspective view of the cell structure of memory cells 100 and 200 in accordance with one embodiment of the present invention. FIG. 3 is an upper plan view of the semiconductor memory device of FIG. 2. FIG. 4A is a sectional view along line I–I' of FIG. 3 and FIG. 4B is a sectional view along line II–II' of FIG. 3.

Referring to FIGS. 2, 3, 4A, and 4B, an N$^-$-type diffusion layer 2 is formed in a P-type silicon substrate 1. N$^-$-type diffusion layer 2 has a higher impurity concentration than p-type silicon substrate 1, typically on the order of $1*10^{19}$ cm$^{-3}$ and serves as a buried plate electrode for memory cells 100 and 200. An N$^+$-type polysilicon layer 8, having an impurity concentration of $5*10^{21}$ cm$^{-3}$ serving as a storage node is formed in a trench 50 and is insulated from N$^-$-type diffusion layer 2 by a capacitor insulating film 7. Capacitor insulating film 7 may, for example, be a nitride/oxide (NO) layered film (e.g., Si$_3$N$_4$, SiO$_2$). A storage node cap oxide 10 is formed on the top surface of the N$^+$-type polysilicon layer 8. An oxide film 11, 13 is formed on the surface of silicon substrate 1 above storage nodes 8. A silicon layer 52 formed on oxide film 11, 13 provides an SOI structure. Transfer transistors 51 and 151 are formed in silicon layer 52. Each transfer transistor includes N$^-$-type source/drain regions 31. A typical value for the impurity concentration of the source/drain regions 31 is $5*10^{20}$ cm$^{-3}$. An isolation film 20 of silicon dioxide, for example, formed on oxide film 11 isolates adjacent memory cells 100 and 200 from each other. Through holes which extend through cap oxide 10, oxide film 11 and 13, and silicon layer 52 provide for an electrical connection between the source/drain regions 31 of the transfer transistors and the storage nodes 8. As$^+$-doped polysilicon layers 23 are formed in through holes. Impurities other than As are also suitable such as P$^+$-doped poly Si. During processing, impurities from As$^+$-doped polysilicon layers 23 diffuse into source/drain regions 31 to form N$^+$-type diffusion regions 25. A cap oxide 24 of silicon dioxide, for example, is formed by oxidation of through hole polysilicon layers 23. Gate oxide 27 of silicon dioxide, for example, is formed by oxidation of silicon layer 52. To get a strong and clear signal for accurate alignment of through hole As$^+$-doped polysilicon layer 23 to storage node 8, the surface of storage node 8 has a step height to the surface of the silicon substrate. According to an exemplary embodiment, the step height is approximately 50 nm.

The isolation between storage nodes 8 and transfer transistors 51 and 151 is achieved by oxide 11 and 13, storage node cap oxide 10, and the substrate oxide 3 and silicon nitride Si$_3$N$_4$ film 4. A bit line 35 is connected to diffusion layer 31 in a self-aligned manner by a bit line contact 34 using a highly selective reactive ion etching between BPSG film 33 and silicon nitride films 29 and 32.

In accordance with this structure, a DRAM cell with a large storage capacitance with a shallow trench depth, even in a small cell area, can have a low soft-error rate, a reduction in process complexity, a good alignment accuracy between a through hole (TH) and an active area (AA) and a deep trench (DT), and no short between a through hole and a buried plate 2. As shown in FIG. 2, there are two gate electrodes arranged above each storage node 8. By using the present invention, if the misalignment between the through hole and the memory node 8 exists, it does not cause an undesired connection, e.g., no connection exists between the through hole and a buried plate electrode 2.

Figure 5A:
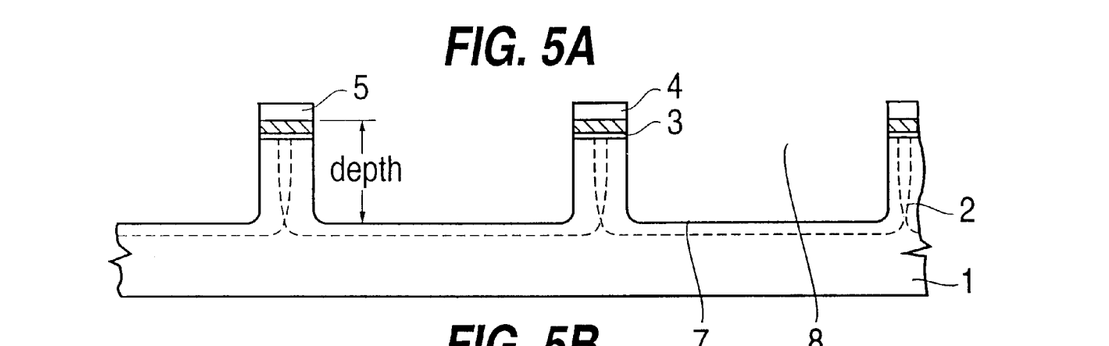
FIGS. 5A–5J are sectional views showing the steps of manufacturing memory cells in accordance with the present invention.

A method for manufacturing the above-described semiconductor memory device will be set forth with reference to FIG. 5A. With reference to FIG. 5A, a first P-type silicon substrate 1 is prepared to have a resistivity of about 1Ω cm. An N-type well 2 is formed in semiconductor substrate 1 by implanting phosphorus ions at a dosage of $1\times10^{15}$/cm$^2$ using an acceleration voltage of 1.5 MeV with a resist mask and then heating the substrate at about 1150° C. for about 4 to 5 hours resulting in an N-type well having a depth of 6 μm. Also, instead of the implant method, a phosphorus (P$^+$) diffusion method from the trench surface can be used to form N-type well 2. The drawings show the phosphorus diffusion method. Next, a pad oxidation is performed, at 900° C. with dry O$_2$, to form a pad oxide layer 3 of silicon dioxide, for example, which has a thickness of about 10 nanometers. A pad silicon nitride (Si$_3$N$_4$) layer 4 of about 100 nanometers is then formed on pad oxide layer 3 by CVD. A TEOS (Si(OC$_2$H$_5$)$_4$) SiO$_2$ film deposition is carried out to form a pad silicon dioxide layer 5 of approximately 400 nanometers on pad silicon dioxide layer 4. Openings of trenches having a depth of about 4 micrometers are formed in silicon substrate 1 using a patterned resist and a TEOS SiO$_2$ film as an etching mask and an etching process such as reactive ion etching (RIE). A phosphosilicate glass (PSG) layer (not shown) is then formed on the resulting structure. A diffusion layer 2 having a depth of 0.5 μm is then formed by thermal diffusion (1000° C., N$_2$, 160 min.) from the PSG film from a trench surface.

Figure 5B:
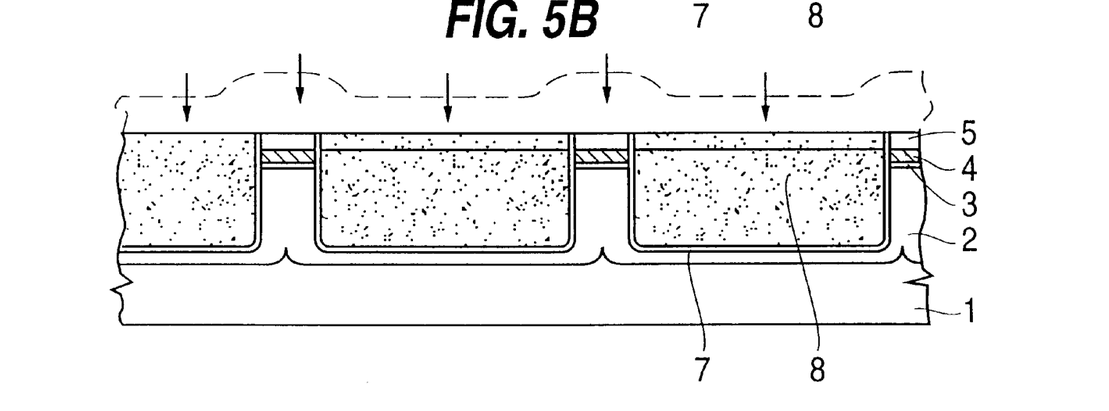

Referring to FIG. 5B, after removing the PSG film using wet etching with a chemical such as HF, a node dielectric film 7 is formed on the side walls and bottom wall of the trenches. Node dielectric film 7 may, for example, be a nitride/oxide (NO) film (e.g., Si$_3$N$_4$/SiO$_2$) including a silicon nitride (Si$_3$N$_4$) layer of about 6 nanometers deposited using an LPCVD method and a silicon dioxide (SiO$_2$) layer of about 2 nanometers formed by reoxidation of a top silicon nitride film surface at 900° C. with wet $O_2$. The target thickness for the dielectric film 7 ($T_{effective}$) is about 40–50 Å silicon dioxide ($SiO_2$) equivalent. $T_{effective}$ refers to the effective thickness of the NO layer relative to a corresponding silicon dioxide ($SiO_2$) layer. In this embodiment, a nitride/oxide (NO) layer, namely a laminated structure of a silicon nitride ($Si_3N_4$) layer and a silicon dioxide ($SiO_2$) layer, is used as the node dielectric film 7. This arrangement is for exemplary purposes only, and the present invention is not limited in this respect. Other dielectric material films can serve as a capacitor dielectric film.

$N^+$-type (e.g., arsenic or phosphorus doped) polysilicon layer 8 is deposited by LPCVD to fill the trenches and to cover TEOS layer 5. Polysilicon layer 8 serves as a storage node (first) electrode for the memory cell capacitor. A second electrode of the memory cell capacitor is formed by substrate N-type well 2 formed in substrate 1. The upper surface of polycrystalline silicon layer 8 is then planarized using chemical mechanical polishing (CMP) to provide a planar surface with a maximum variation of about 500 Å. In the present embodiment, the upper surface of polysilicon layer 8 is planarized to be level with pad TEOS layer 5. In this embodiment, it is important that the upper surface of layer 8 be very flat. This upper surface of polysilicon layer 8 is attached to another layer through $SiO_2$ film 11 in a subsequent step, so the accuracy of the flatness of the upper surface of polysilicon layer 8 is very important.

Figure 5C:
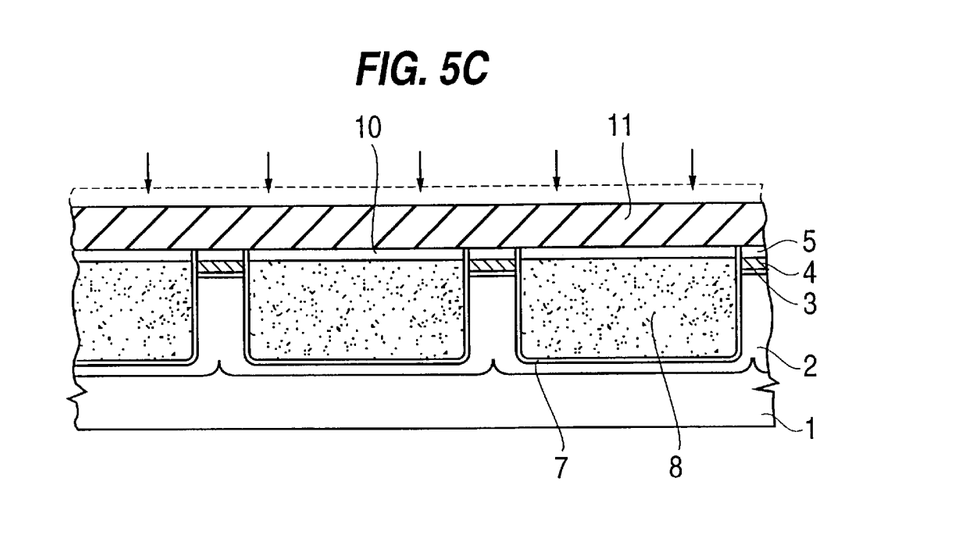

With reference to FIG. 5C, the upper surface of polysilicon layer 8 is then thermally oxidized at 1000° C. with dry $O_2$ to form a silicon dioxide ($SiO_2$) layer 10 having a thickness of about 20 nanometers. If necessary, another planarization process, such as CMP, for example, may be carried out to obtain good surface planarity (i.e., flatness). Next, a first borophosphosilicate glass (BPSG) or phosphosilicate glass(PSG) layer 11 of about 200 nanometers is deposited by CVD. Layer 11 is then planarized using, for example, CMP, to yield a layer 11 having a final thickness of about 100 nanometers and a planar surface with a maximum variation which should not exceed 500 Å across the chip area.

Figure 5D:
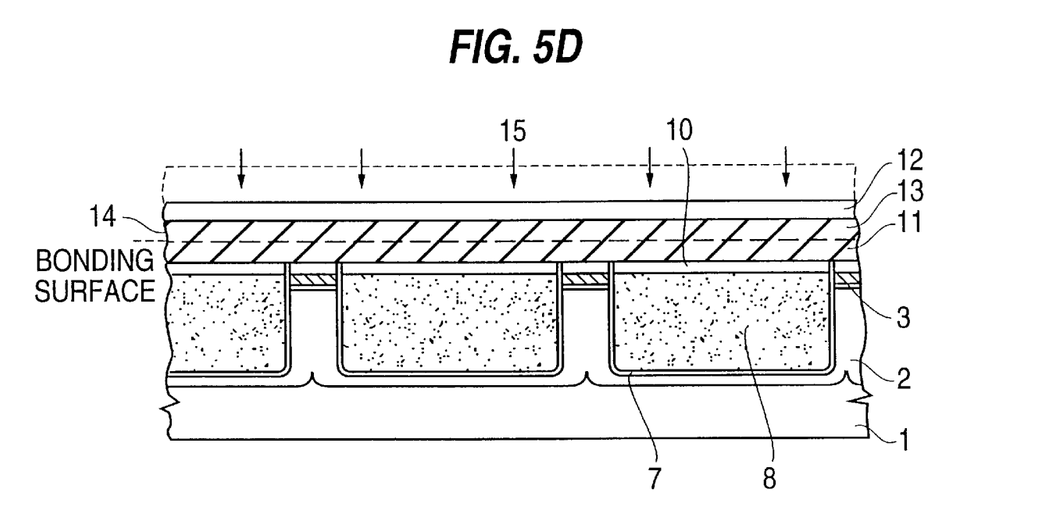

With reference to FIG. 5D, a P-type second silicon substrate 12 having a second layer 13 of BPSG or PSG formed thereon to a thickness of about 100 nanometers is bonded to layer 11. Specifically, layer 13 is bonded to layer 11 via bonding surface 14. This bonding process will be described in greater detail below with reference to FIGS. 6A–6C. Silicon substrate 12 is then polished to form a silicon layer 12 which is about 80 nanometers thick. Silicon substrate 12 may be polished using a variety of methods known in the art.

Figure 5E:
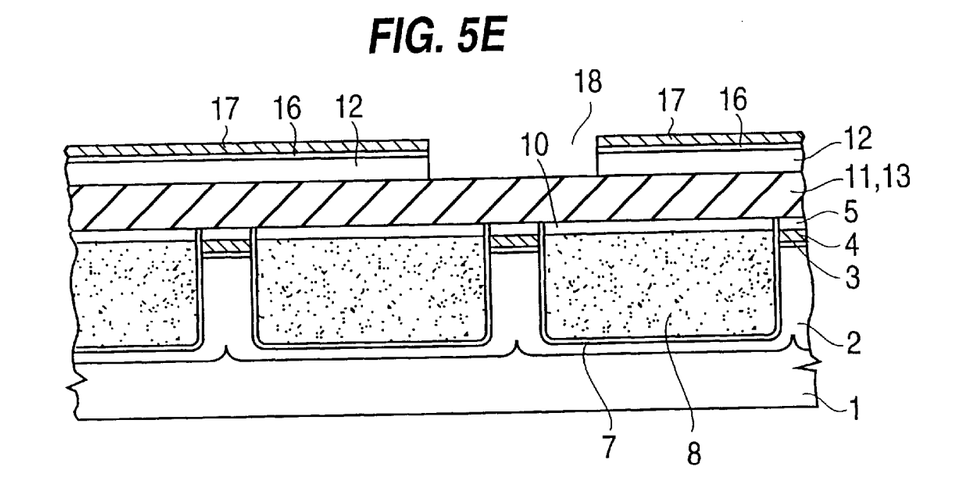

With reference to FIG. 5E, a pad silicon dioxide ($SiO_2$) layer 16 having a thickness of about 8 nanometers is formed on silicon layer 12. A pad silicon nitride ($Si_3N_4$) layer 17 having a thickness of about 50 nanometers is then formed on pad silicon dioxide layer 16. Subsequently, an opening 18 is formed using a patterned photoresist and an etching process, to define SOI islands.

Figure 5F:
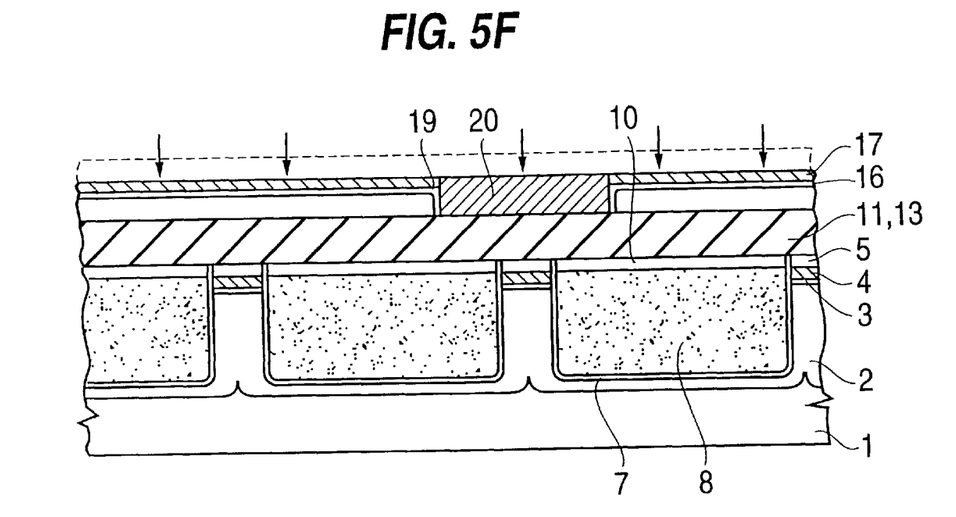

Referring now to FIG. 5F, the sidewalls of opening 18 are thermally oxidized at 900° C. with dry $O_2$ to form a silicon dioxide ($SiO_2$) layer 19 having a thickness of about 10 nanometers. Subsequently, a TEOS silicon dioxide ($SiO_2$) film 20 having a thickness of about 200 nanometers is deposited in opening 18 and over the entire surface. Film 20 is then planarized using CMP, for example. Silicon nitride ($Si_3N_4$) pad layer 17 serves as a CMP stopper layer.

Figure 5G:
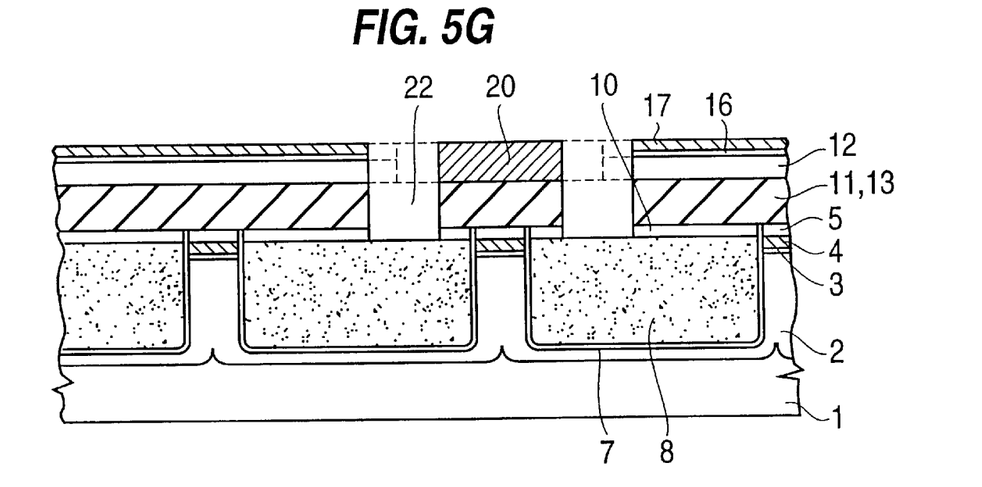

Referring now to FIG. 5G, through holes 22 are formed through pad layers 17 and 16, Si layer 12, TEOS layer 20, layers 13 and 11, and cap oxide 10 by etching to expose an upper surface of a portion of storage nodes 8. The through holes 22 are formed by reactive ion etching (RIE) having a selection ratio greater than 10 with respect to the silicon nitride ($Si_3N_4$) layer which covers the Si substrate $N^+$ diffusion layer 2 surface.

Figure 5H:
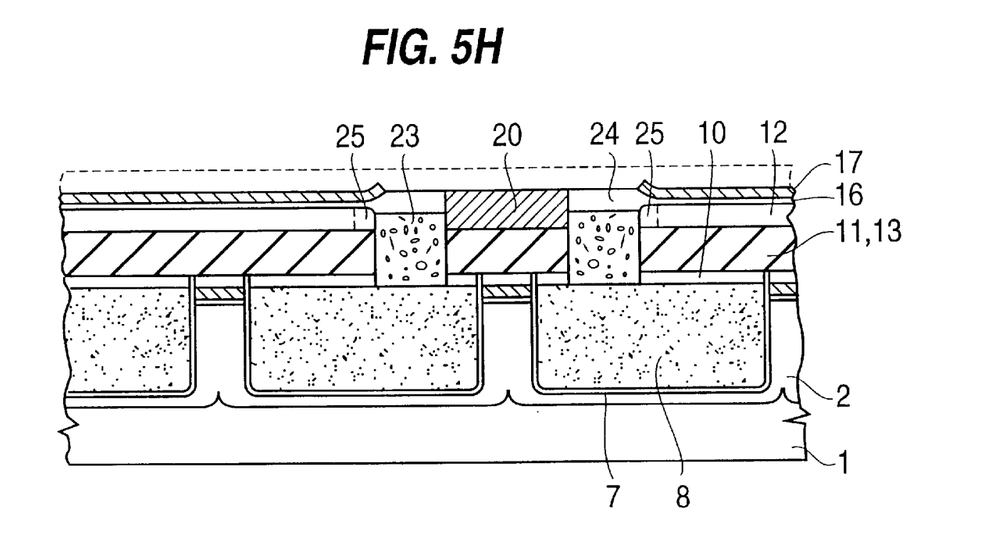

Referring now to FIG. 5H, a polysilicon layer 23 having a thickness of about 200 nanometers is deposited to fill in through holes 22 and to cover the entire surface. Polysilicon layer 23 may be an $N^+$-type (e.g., arsenic) doped polysilicon layer. $As^+$ ions, for example, are implanted after polysilicon layer 23 is deposited. Polysilicon layer 23 is then etched back to a level within through hole 22 using RIE or CMP to form a polysilicon stud. Pad $Si_3N_4$ layer 17 and TEOS film layer 20 serve as etch stop layers. The upper surface of the polysilicon stud is then oxidized to form a cap oxide layer 24 having a thickness of about 35 nanometers. During the cap oxidation, $As^+$ ions are diffused into the SOI silicon layer 12 to form $N^+$-type diffusion layers 25. Pad $Si_3N_4$ layer 17 is a mask for the cap oxidation process.

Figure 5I:
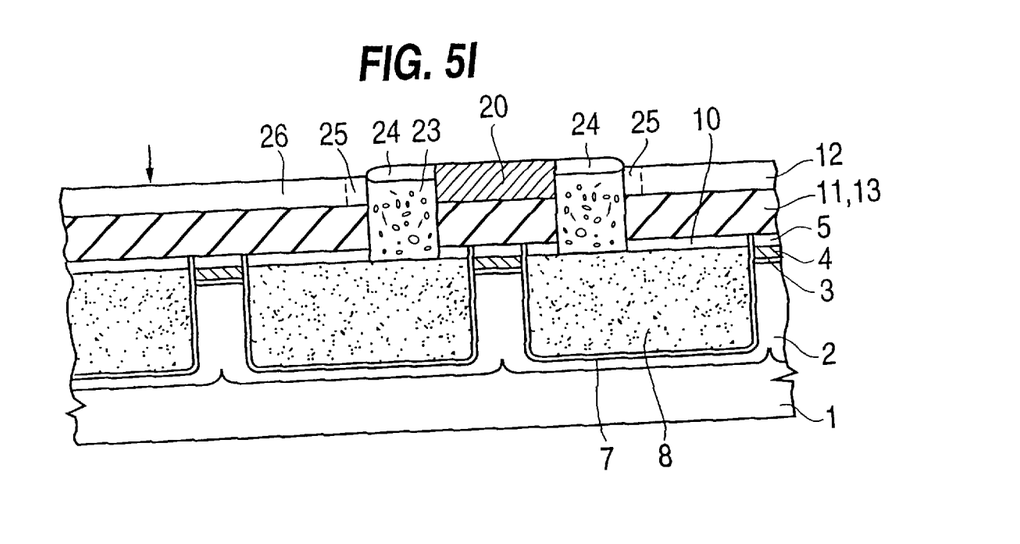

Referring now to FIG. 5I, pad $Si_3N_4$ layer 17 and pad silicon dioxide layer 16 are removed to expose the silicon surface of the SOI layer 12.

Figure 5J:
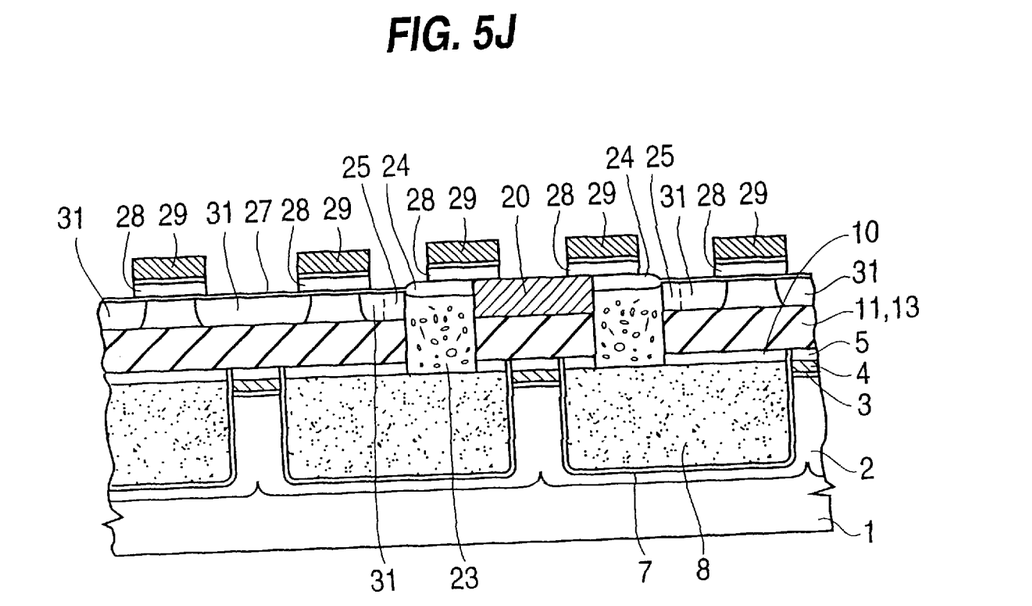

Referring now to FIG. 5J, a gate oxide layer 27 having a thickness of approximately 8 nanometers is formed on the exposed silicon surface. A conductive film 28 (e.g., $N^+$-type polysilicon or $N^+$-type polysilicon+$WSi_2$ film or $P^+$-type polysilicon+$WSi_2$ film) is formed on gate oxide layer 27. Next, a cap silicon nitride film 29 is formed on conductive film 28. Layers 28 and 29 are then etched to form word lines. N-type source/drain layers 31 are formed using ion implantation. Layers 28 and 29 serve as a mask during the implantation process. After this step, the normal DRAM process is carried out. For example, an insulating layer 32 is formed over the surface of the arrangement shown in FIG. 5J followed by the formation of an interlayer insulating film 33 as shown in FIG. 4A and 4B. Bit lines 35 are formed on interlayer insulating film 33 and are connected to source drain regions 31 via bit line contacts 34.

Figure 6A:
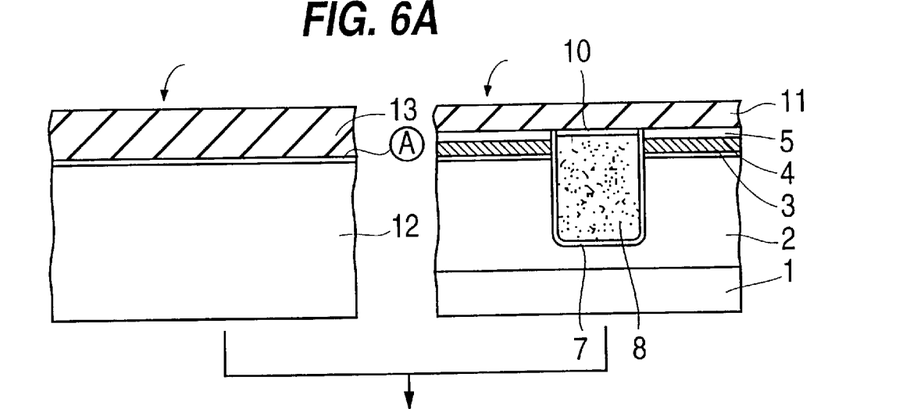
FIGS. 6A–6C are sectional views showing the steps of a wafer bonding method used in the manufacturing method of the present invention.
Figure 6B:
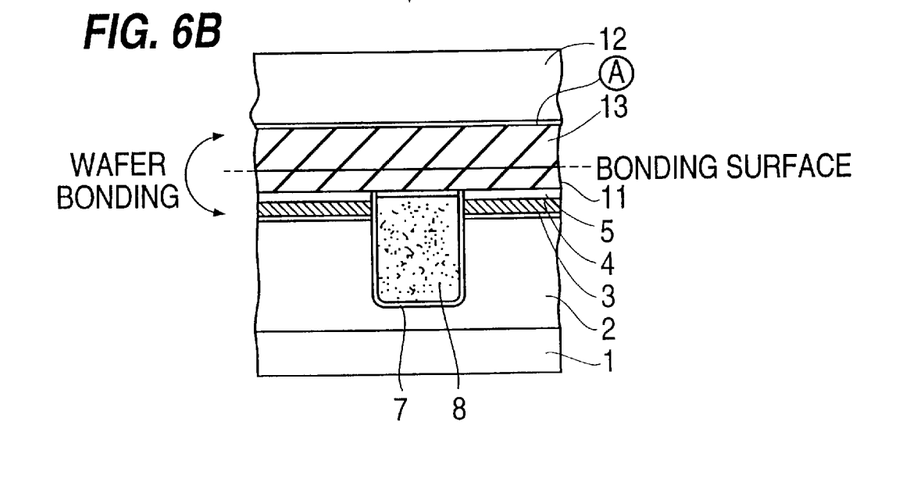
Figure 6C:
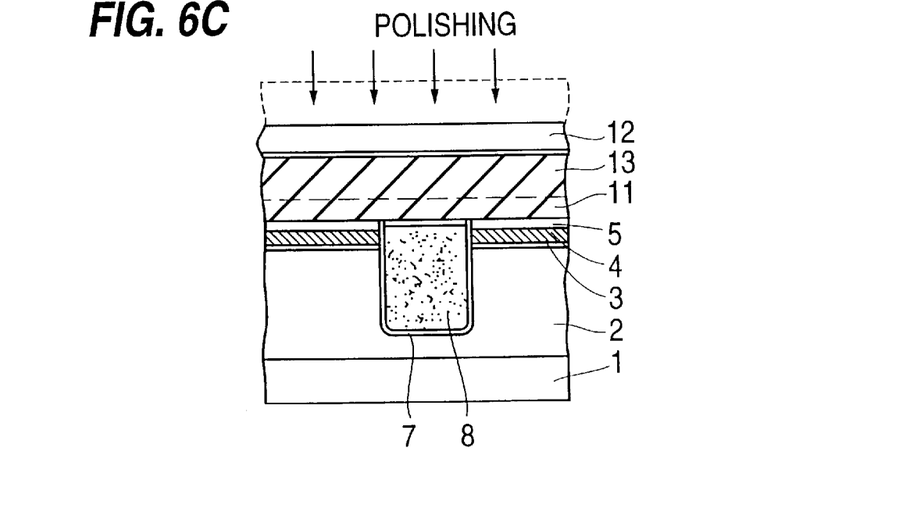

The wafer bonding process will be described in greater detail with reference to FIGS. 6A–6C. As shown in FIG. 6A, the second wafer arrangement includes silicon substrate 12, a silicon dioxide layer A formed to cover silicon substrate 12, and a BPSG layer 13.

The silicon dioxide layer A performs as a diffusion stopper layer from the BPSG layer 13 to silicon substrate 12. The thickness of the silicon dioxide layer A is approximately 15 nm.

The surface of the BPSG layer 13 of the second wafer is bonded to the surface of the BPSG layer 11 of the first wafer.

Next, the silicon substrate 12 of the second wafer is polished until the thickness of the silicon substrate becomes approximately 100 nm.

Figure 7A:
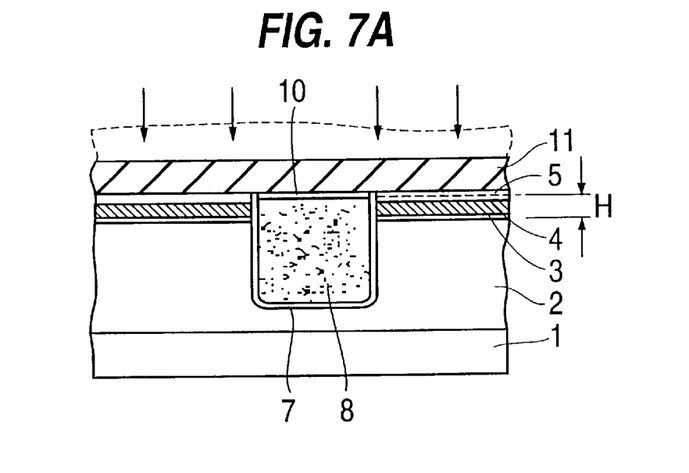
FIG. 7A is a sectional view showing a first method of obtaining a strong alignment from a trench alignment mark to get an accurate alignment between active area (AA) and deep trench (DT), and through hole (TH) and deep trench (DT), respectively.
Figure 7B:
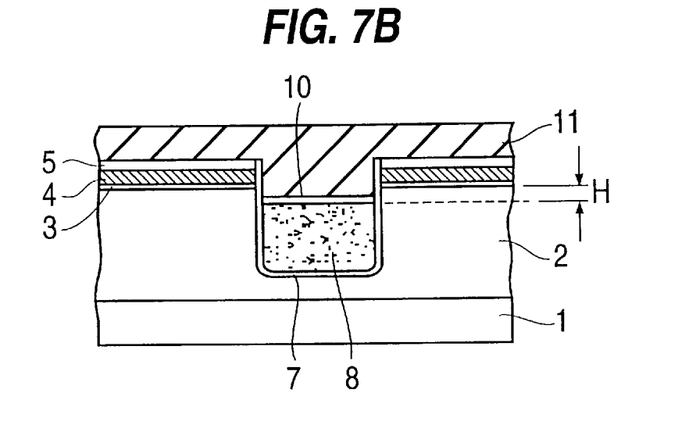
FIG. 7B is a sectional view showing a second method of obtaining a strong alignment from a trench alignment mark to get an accurate alignment between active area (AA) and deep trench (DT), and through hole (TH) and deep trench (DT), respectively.
Figure 7C:
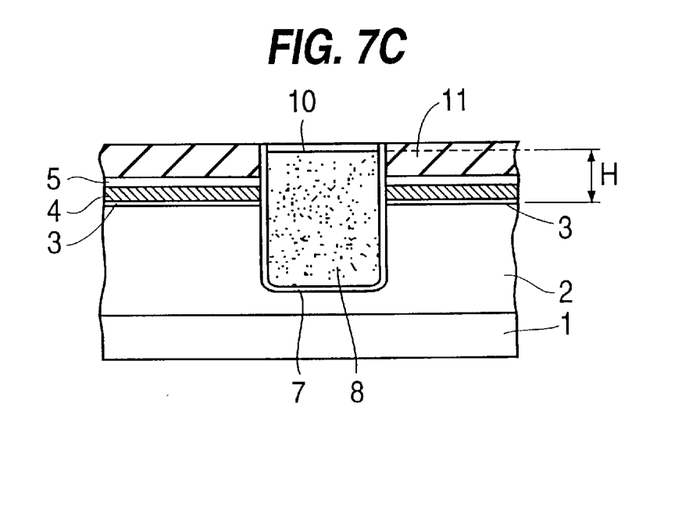
FIG. 7C is a sectional view showing a third method of obtaining a strong alignment signal from a trench alignment mark to get an accurate alignment between active area (AA) and deep trench (DT), respectively.

The method of obtaining a good alignment accuracy signal from a deep trench (DT) mark area which has the same structure as the memory cell area's deep trenches will be described in greater detail with reference to FIGS. 7A–7C. FIGS. 7A–7C show a DT mark structure which has the same structure as a memory cell DT structure. Similar dimensions, such as DT width, are recommended for the mark design. For example, the DT mark width of 0.5 μm is used in a 0.3 μm DT design case in the cell array area. The length of the DT mark depends on the exposure tool alignment system. The step height are is chosen by the process steps used to make a memory cell area. To control the step-height of the mark, similar structures for the width are important.

As shown in FIG. 7A, the surface of polysilicon 8 is higher than the silicon substrate. Thus, a step height H between the surface of n⁻ silicon layer 2 and the surface of the polysilicon 8 is around 50 nanometers.

The above method is an illustrative method of achieving a good alignment signal from a deep trench (DT), resulting from good alignment between AA and DT and Between TH and DT.

A second method is shown in FIG. 7B. In this method, the surface of polysilicon 8 is located approximately 50 nm below the surface of the silicon substrate 2.

A third method is shown in FIG. 7C. In this method, there is no BPSG film over the polysilicon film 8. The BPSG film 11 is only disposed on the $SiO_2$ film 5.

In the above described methods, the probability of an undesired connection between memory node polysilicon 8 and the silicon substrate (buried plate electrode) 2 via a through hole is reduced by high alignment accuracy between TH and DT. By using this invention, if there is misalignment between the location of the trench and the location of the through hole, the chance of a shortage between a buried plate electrode 2 and a storage node electrode 8 via a through hole can be reduced.

The present invention forms the through hole by using the self alignment technique. Also, the present invention increases the surface area of the trench because the trench area can use the area under the transistor.

Figure 9A:
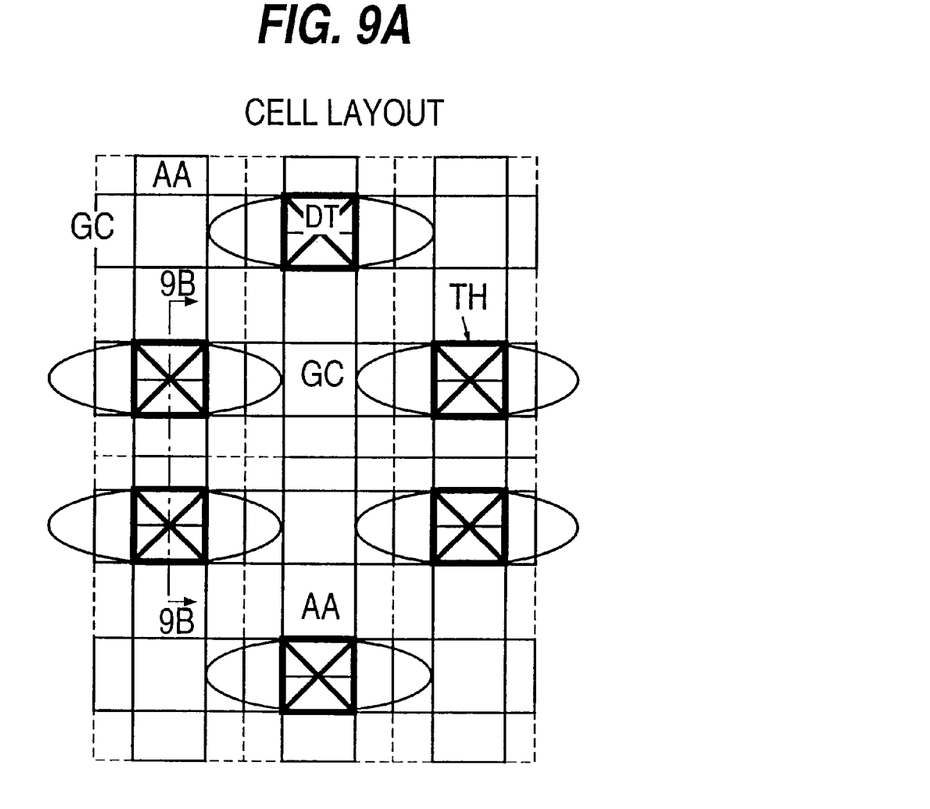
FIG. 9A is another illustrative cell layout according to the present invention.
Figure 9B:
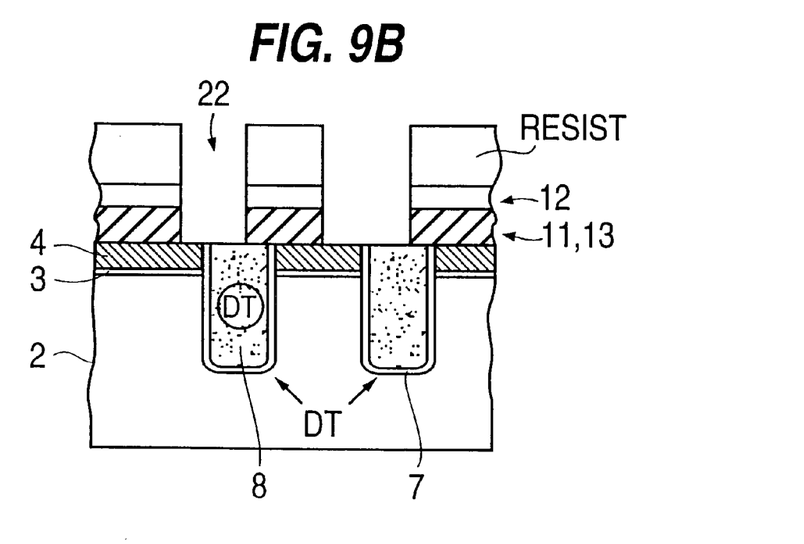
FIG. 9B is a cross section of the cell layout of FIG. 9A along the line A–A'. This corresponds to the process step shown in FIG. 5G.

An illustrative layout of a memory cell array for a typical DRAM according to the present invention is shown in FIG. 9A and a cross section of the layout along the line A–A' is depicted in FIG. 9B. FIGS. 9A and 9B are directed to a borderless connection to a deep trench. The same film stack can be used for a deep trench mask and a borderless mask.

In FIG. 9A, AA represents an active area, DT represents a deep trench, TH represents a through hole, and GC represents a control gate. By providing a step height of approximately 50 nm from the surface of Si substrate 2, good alignment between each of GC and DT, AA and DT, and TH and DT can be realized.

FIG. 9A can be compared to FIG. 3. According to FIG. 3, the deep trench is laid out in the same direction as the active area pattern. However, in FIG. 9A, the deep trench DT is laid out rotated 90° from the active area AA. It is to be understood that the manufacturing process described with reference to FIGS. 5A–5J may be used to realize the layout of FIG. 9A. The only difference between the structure of FIG. 9A and the structure which results when the manufacturing process shown in FIGS. 5A–5J is used is the deep trench layout. FIG. 9B corresponds to the processing step shown in FIG. 5G, but has the deep trench layout for realizing the layout in FIG. 9A.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

I claim:

1. A semiconductor memory device having a first memory cell and a second memory cell, comprising:

a first semiconductor substrate having a first conductivity type;

a first layer having a second conductivity type formed on said first semiconductor substrate and serving as a buried plate electrode;

a first capacitor insulating film formed on said first layer in the first memory cell;

a second capacitor insulating film formed on said first layer in the second memory cell;

a second layer contacting the first capacitor insulating film having a second conductivity type serving as a memory node;

a third layer contacting the second capacitor insulating film having a second conductivity type serving as a memory node;

a first cap oxide film formed on the second layer;

a second cap oxide film formed on the third layer;

a first oxide film formed on the surface of the first cap oxide film;

a second oxide film formed on the surface of the second cap oxide film;

a first transfer transistor formed on the first oxide film having a source and drain region of the second conductivity type;

a second transfer transistor formed on the second oxide film having a source and drain region of the second conductivity type;

an isolation film formed on the first and second oxide films isolating the first memory cell and the second memory cell;

a first polysilicon region electrically connecting the second layer and the source and drain regions of the first transfer transistor;

a second polysilicon region electrically connecting the third layer and the source and drain regions of the second transfer transistor;

a third cap oxide formed on the first polysilicon region;

a fourth cap oxide formed on the second polysilicon region;

a first gate electrode formed on the third cap oxide formed on the first polysilicon region serving as a gate electrode of a third transistor; and a second gate electrode formed on the fourth cap oxide formed on the second polysilicon region serving as a gate electrode of a fourth transistor, wherein an upper surface of the first semiconductor substrate and an upper surface of the second layer and the third layer form a step height.

2. A semiconductor memory device according to claim 1, wherein the upper surface of the first semiconductor substrate is lower than the upper surface of the second layer.

3. A semiconductor memory device according to claim 1, wherein the upper surface of the first semiconductor substrate is higher than the surface of the second layer.

4. A semiconductor memory device according to claim 1, further comprising a first diffusion region having the second conductivity type connected between the second layer and the source and drain region of the first transfer transistor.

5. A semiconductor memory device comprising:

a semiconductor substrate of a first conductive type;

a first layer of a second conductive type on said semiconductor substrate and serving as a buried plate electrode;

a capacitor insulating film on said first layer in a memory cell;

9 a second layer of the second conductive type contacting said capacitor insulating film and serving as a storage node;

an insulating film formed above said second layer;

a silicon layer formed on said insulating film;

a transfer transistor having a source region and a drain region which are formed in said silicon layer; and a conductive layer electrically connecting said second layer to one of the source and drain regions of said transfer transistor, wherein an upper surface of said semiconductor substrate and an upper surface of said second layer form a step height greater than a thickness of said capacitor insulating film.

6. A device according to claim 5, further comprising a diffusion region formed in said silicon layer, and connecting said one of the source and drain regions of said transfer transistor to said conductive layer within said silicon layer.

7. A semiconductor memory device comprising:

a semiconductor substrate of a first conductive type;

a trench formed in said semiconductor substrate;

a first layer of a second conductive type formed in a portion of said semiconductor substrate which defines said trench, and serving as a buried plate electrode;

a capacitor insulating film formed on a surface of said trench;

a second layer of the second conductive type formed in said trench, serving as a storage node, wherein an upper surface of said semiconductor substrate and an upper surface of said second layer form a step therebetween, a level of said upper surface of the second layer is higher than a level of said upper surface of said semiconductor substrate, and a difference in the level between the upper surface of the second layer and the upper surface of the semiconductor substrate is greater than a thickness of the capacitor insulating film;

an insulating film formed above said second layer;

a silicon layer formed on said insulating film;

a transfer transistor having a source region, a drain region and a gate electrode, the source and drain regions being formed in said silicon layer, said gate electrode including a part of a word line provided above said silicon layer such that the word line is insulated from said silicon layer;

a through hole extending through said insulating film and said silicon layer; and a conductive layer in said through hole, and electrically connecting said second layer to one of the source and drain regions of said transfer transistor.

8. A device according to claim 7, further comprising a diffusion region formed in said silicon layer, and connecting said one of the source and drain regions of said transfer transistor to said conductive layer within said silicon layer.

9. A device according to claim 7, wherein said trench has a longitudinal axis and a transverse axis, the longitudinal axis of said trench being parallel to the word line.

10. A device according to claim 7, wherein said trench has a longitudinal axis and a transverse axis, the longitudinal axis of said trench being perpendicular to the word line.

11. A semiconductor memory device according to claim 7, further comprising a first diffusion region having the second conductivity type connected between the second layer and one of the source and drain regions of the first transfer transistor.

10

12. A semiconductor memory device comprising:

a first semiconductor substrate of a first conductive type;

an insulating film formed on a surface of the first semiconductor substrate;

a second semiconductor substrate of the first conductive type formed above said insulating film;

a trench formed in said first semiconductor substrate;

a first layer of a second conductive type formed in a portion of said first semiconductor substrate which defines said trench, and serving as a buried plate electrode;

a capacitor insulating film formed on a surface of said trench;

a second layer of the second conductive type formed in said trench, serving as a storage node, wherein an upper surface of said first semiconductor substrate and an upper surface of said second layer form a step therebetween, a level of said upper surface of the second layer is higher than a level of said upper surface of said first semiconductor substrate, and a difference in the level between the upper surface of the second layer and the upper surface of the first semiconductor substrate is greater than a thickness of the capacitor insulating film;

a transfer transistor having a source region, a drain region and a gate electrode, the source and drain regions being formed in said second semiconductor substrate, the gate electrode including a part of a word line above said second semiconductor substrate such that the word line is insulated from said second semiconductor substrate;

a through hole extending through said insulating film and said second semiconductor substrate; and a conductive layer formed in said through hole, and electrically connecting said second layer to one of the source and drain regions of said transfer transistor.

13. A device according to claim 12, wherein said trench has a longitudinal axis and a transverse axis, the longitudinal axis of said trench being parallel to the word line.

14. A device according to claim 12, wherein said trench has a longitudinal axis and a transverse axis, the longitudinal axis of said trench being perpendicular to the word line.

15. A semiconductor memory device according to claim 12, further comprising a first diffusion region having the second conductivity type connected between the second layer and one of the source and drain regions of the first transfer transistor.

16. A semiconductor memory device comprising:

a semiconductor substrate of a first conductive type;

a trench formed in said semiconductor substrate;

a first layer of a second conductive type formed on a portion of said semiconductor substrate which defines said trench, and serving as a buried plate electrode;

a capacitor insulating film formed on a surface of said trench;

a second layer of the second conductive type formed in said trench, serving as a storage node, wherein an upper surface of said semiconductor substrate and an upper surface of said second layer form a step therebetween and a level of said upper surface of the second layer is lower than a level of said upper surface of said semiconductor substrate;

an insulating film formed above said second layer;

a silicon layer formed on said insulating film;

a transfer transistor having a source region, a drain region and a gate electrode, the source and drain regions being formed in said silicon layer, said gate electrode including a part of a word line provided above said silicon layer such that the word line is insulated from said silicon layer;

a through hole extending through said insulating film and said silicon layer; and a conductive layer in said through hole, and electrically connecting said second layer to one of the source and drain regions of said transfer transistor.

17. A device according to claim 16, further comprising a diffusion region formed in said silicon layer, and connecting said one of the source and drain regions of said transfer transistor to said conductive layer within said silicon layer.

18. A device according to claim 16, wherein said trench has a longitudinal axis and a transverse axis, the longitudinal axis of said trench being parallel to the word line.

19. A device according to claim 16, wherein said trench has a longitudinal axis and a transverse axis, the longitudinal axis of said trench being perpendicular to the word line.

20. A semiconductor memory device according to claim 16, further comprising a first diffusion region having the second conductivity type connected between the second layer and one of the source and drain regions of the first transfer transistor.

21. A semiconductor memory device comprising:

a first semiconductor substrate of a first conductive type;

an insulating film formed on a surface of the first semiconductor substrate;

a second semiconductor substrate of the first conductive type formed above said insulating film;

a trench formed in said first semiconductor substrate;

a first layer of a second conductive type formed in a portion of said first semiconductor substrate which defines said trench, and serving as a buried plate electrode;

a capacitor insulating film formed on a surface of said trench;

a second layer of the second conductive type formed in said trench, serving as a storage node, wherein an upper surface of said first semiconductor substrate and an upper surface of said second layer form a step therebetween and a level of said upper surface of the second layer is lower than a level of said upper surface of said first semiconductor substrate;

a transfer transistor having a source region, a drain region and a gate electrode, the source and drain regions being formed in said second semiconductor substrate, the gate electrode including a part of a word line above said second semiconductor substrate such that the word line is insulated from said second semiconductor substrate;

a through hole extending through said insulating film and said second semiconductor substrate; and a conductive layer formed in said through hole, and electrically connecting said second layer to one of the source and drain regions of said transfer transistor.

22. A device according to claim 21, wherein said trench has a longitudinal axis and a transverse axis, the longitudinal axis of said trench being parallel to the word line.

23. A device according to claim 21, wherein said trench has a longitudinal axis and a transverse axis, the longitudinal axis of said trench being perpendicular to the word line.

24. A semiconductor memory device according to claim 21, further comprising a first diffusion region having the second conductivity type connected between the second layer and one of the source and drain regions of the first transfer transistor.

25. A semiconductor memory device according to claim 5, wherein the upper surface of said semiconductor substrate is higher than the upper surface of said second layer.

26. A semiconductor memory device according to claim 5, wherein the upper surface of said semiconductor substrate is lower than the upper surface of said second layer.

* * * * *